(12) United States Patent
Jeon

(10) Patent No.: US 8,612,665 B2
(45) Date of Patent: Dec. 17, 2013

(54) MEMORY SYSTEM AND DATA TRANSFER METHOD THEREOF

(75) Inventor: Tae-Keun Jeon, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 1118 days.

(21) Appl. No.: 11/694,301

(22) Filed: Mar. 30, 2007

(65) Prior Publication Data

US 2008/0140914 A1 Jun. 12, 2008

(30) Foreign Application Priority Data

Dec. 7, 2006 (KR) .......................... 10-2006-123966

(51) Int. Cl.
*G06F 12/00* (2006.01)

(52) U.S. Cl.
USPC .................................. 711/103; 711/E12.081

(58) Field of Classification Search
USPC ............................................ 711/103; 710/22
See application file for complete search history.

(56) References Cited

U.S. PATENT DOCUMENTS

| | | | |
|---|---|---|---|
| 5,559,952 A * | 9/1996 | Fujimoto ...................... 345/557 |
| 6,570,809 B1 | 5/2003 | Lin |
| 6,883,063 B2 | 4/2005 | Blumenau et al. |
| 7,409,473 B2 | 8/2008 | Conley et al. |
| 7,555,625 B2 * | 6/2009 | Nam .............................. 711/165 |
| 7,685,376 B2 * | 3/2010 | Zimmer et al. ............... 711/154 |
| 2003/0200406 A1 * | 10/2003 | Kouno .......................... 711/164 |
| 2004/0064612 A1 * | 4/2004 | Pinto et al. .................... 710/105 |
| 2005/0114613 A1 | 5/2005 | Otani et al. |
| 2006/0193189 A1 | 8/2006 | Nam |

FOREIGN PATENT DOCUMENTS

| | | |
|---|---|---|
| KR | 1020060038105 | 5/2006 |
| KR | 1020060051589 | 5/2006 |
| KR | 10-0609623 | 7/2006 |

OTHER PUBLICATIONS

English Abstract for Publication No. 10-0609623, Jul. 31, 2006.
English Abstract for Publication No. 10-2006-0038105, May 3, 2006.
English Abstract for Publication No. 10-2006-0051589, May 19, 2006.

\* cited by examiner

*Primary Examiner* — Reginald Bragdon
*Assistant Examiner* — Hamdy S Ahmed
(74) *Attorney, Agent, or Firm* — F. Chau & Associates, LLC

(57) ABSTRACT

A method for transferring data in a memory system including at least first and second memories, includes activating the first memory to conduct a read operation, activating the second memory during the read operation of the first memory, and transferring data which is obtained from the read operation, directly to the second memory from the first memory.

23 Claims, 7 Drawing Sheets

MEMORY SYSTEM AND DATA TRANSFER METHOD THEREOF

CROSS-REFERENCE TO RELATED APPLICATIONS

This U.S. non-provisional patent application claims priority under 35 U.S.C. §119 of Korean Patent Application No. 2006-123966 filed on Dec. 7, 2006, the entire contents of which are hereby incorporated by reference.

BACKGROUND

1. Field of the Invention

The present invention disclosed herein relates to memory systems and more particularly, to a memory system and method for transferring data between pluralities of memories.

2. Description of Related Art

FIG. 1 is a block diagram of a memory system 100. Referring to FIG. 1, the memory system 100 includes a controller 120, and memories 140 and 160. The memories 140 and 160 are NAND flash memories. The memories 140 and 160 are connected to the controller 120 by way of a common bus. Chip-enable pins CEb and ready/busy pin RBb of the memories 140 and 160 are independently connected to the controller 120.

FIG. 2 is a schematic illustrating a pattern of data transmission between memories 140 and 160 in the memory system 100. In the memory system 100, a procedure for transferring data from a source page 144 of the first memory 140 to a destination page 164 of the second memory 160 is as follows. Referring to FIG. 2, first, data of the source page 144 of the first memory 140 is transferred to a page buffer 146 (①). Then, the data transferred to the page buffer 146 is transferred to a buffer 122 of the controller 120 (②). Next, the data transferred to the buffer 122 of the controller 110 is transferred to a page buffer 166 of the second memory 160 (③). Subsequently, the data transferred to the page buffer 166 is transferred to the destination page 164 of the second memory 160 (④).

FIG. 3 is a timing diagram according to the data transmission pattern shown in FIG. 2. Referring to FIG. 3, the memory system 100 is operable with data transmission by reading page data from the first memory 140 and writing the read page data into the second memory 160. The controller 120 selects the memories 120 and 140, and transfers a read or write command for a selected one of the memories. Each of the memories 140 and 160 generates the ready/busy signal RBb0 or RBb1, for interrupting access from the controller 120, while conducting the read or write operation.

While a page size of the NAND flash memory is large, the memory system 100 needs to conduct a write operation after a read operation to accomplish data transmission between NAND flash memories. Therefore, a data transmission time becomes longer with the page size.

SUMMARY OF THE INVENTION

According to an embodiment of the present invention, a method for transferring data in a memory system including at least first and second memories, includes activating the first memory to conduct a read operation, activating the second memory during the read operation of the first memory, and transferring data, which is obtained from the read operation, directly to the second memory from the first memory.

According to an embodiment of the present invention, the memory system further includes a controller operating to control the first and second memories. The data read through the read operation is directly transferred to the second memory without passing through the controller.

According to an embodiment, the first and second memories share a data bus for receiving a command, an address, and the data from the controller.

According to an embodiment, the first and second memories are NAND flash memories.

According to an embodiment, the activating of the first memory to conduct the read operation includes loading the data of a source page into a first page buffer of the first memory in response to a read command, and outputting the data, which is loaded into the first page buffer, to the data bus.

According to an embodiment, the activating of the second memory during the read operation includes transferring the data, which is output to the data bus by the activating of the first memory to conduct the read operation, to a second page buffer of the second memory, and storing the data into a destination page of the second page buffer.

According to an embodiment, the first and second memories receive chip-enable signals (CEb), read-enable signals (REb), write-enable signals (WEb), and ready/busy signals (RBb) each through respective lines from the controller.

According to an embodiment, in the activating of the first memory to conduct the read operation, the second memory is inactive while the read command and an address of the source page are being transferred to the first memory.

According to an embodiment, in the activating of the second memory during the read operation, the first memory is being inactive while the write command and an address of the destination page are being transferred to the second memory.

According to an embodiment, after transferring the address of the second memory, the first memory is activated.

According to an embodiment, after the data is transferred to the second page buffer of the second memory from the first page buffer of the first memory, the first memory maintains an inactive state.

According to an embodiment, while the data is transferred to the second memory from the first memory, the read-enable signal (REb) and the write-enable signal (WEb) are simultaneously transferred to the first memory and the second memory, respectively.

According to an embodiment of the present invention a system includes a first memory, a second memory, and a controller operating to control the first and second memories. The controller operates the first memory for a read operation and controls the first and second memories to transfer data, which is obtained by the read operation, directly to the second memory from the first memory.

According to an embodiment, the first and second memories are NAND flash memories.

According to an embodiment, the first and second memories receive chip-enable signals (CEb), read-enable signals (REb), write-enable signals (WEb), and ready/busy signals (RBb) each through respective lines from the controller so as to transfer the data directly into the second memory from the first memory without passing through the controller.

According to an embodiment, the second memory maintains an inactive state while transferring the data into the second memory from the first memory and while transferring a read command and an address of a source page to the first memory.

According to an embodiment, the first memory maintains an inactive state while transferring the data into the second memory from the first memory and while transferring a write command and an address of a destination page to the second memory.

According to an embodiment, after transferring the address of the second memory, the first memory is activated.

According to an embodiment, the first memory and the second memory comprise a first page buffer and a second page buffer, respectively, and after the data is transferred to the second page buffer of the second memory from the first page buffer of the first memory, the first memory maintains an inactive state.

According to an embodiment, while the data is transferred to the second memory from the first memory, the read-enable signal (REb) and the write-enable signal (WEb) are simultaneously transferred to the first memory and the second memory, respectively.

According to an embodiment, the memory system is a memory card.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Figure 1:
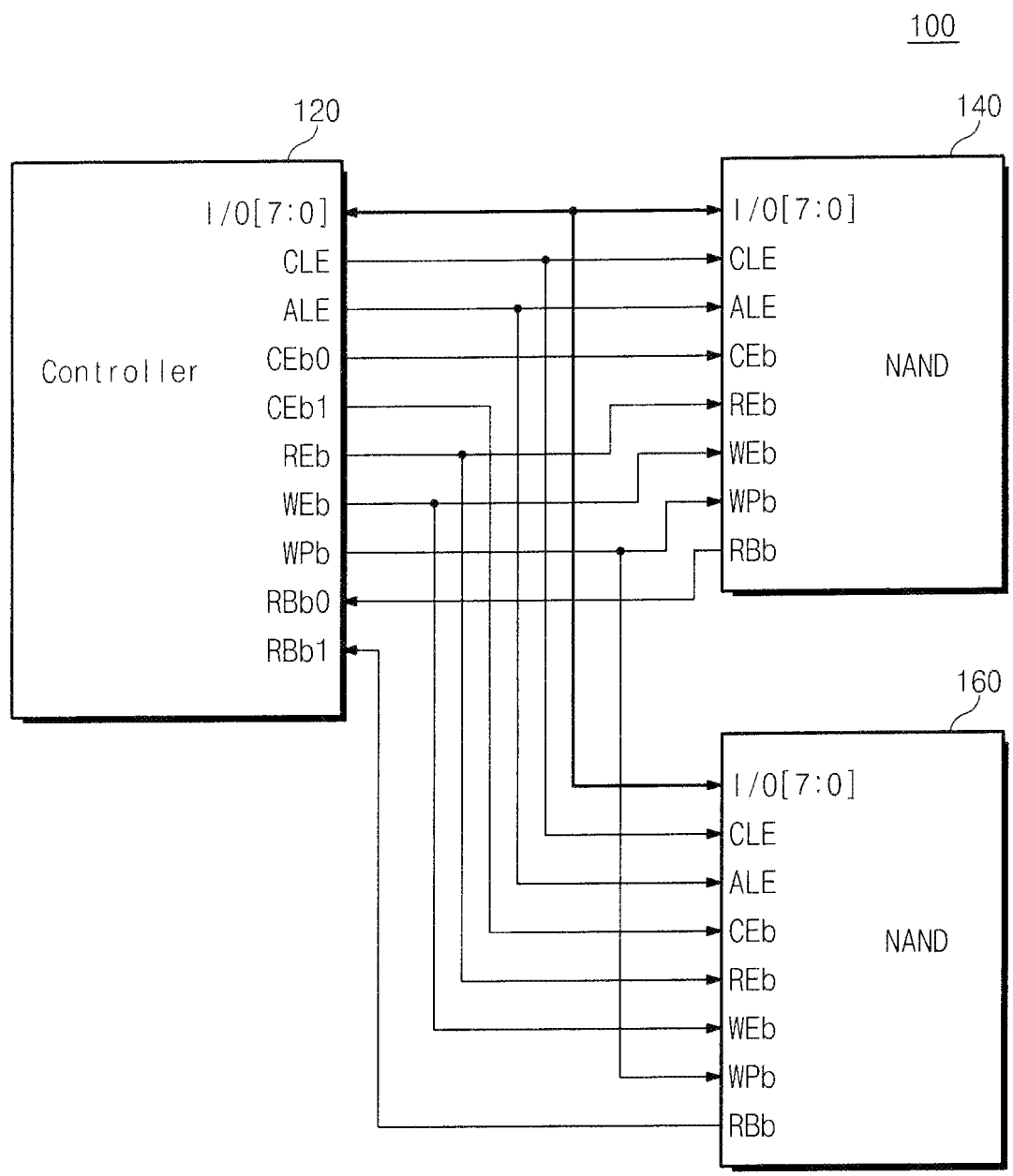
FIG. 1 is a block diagram of a memory system.
Figure 2:
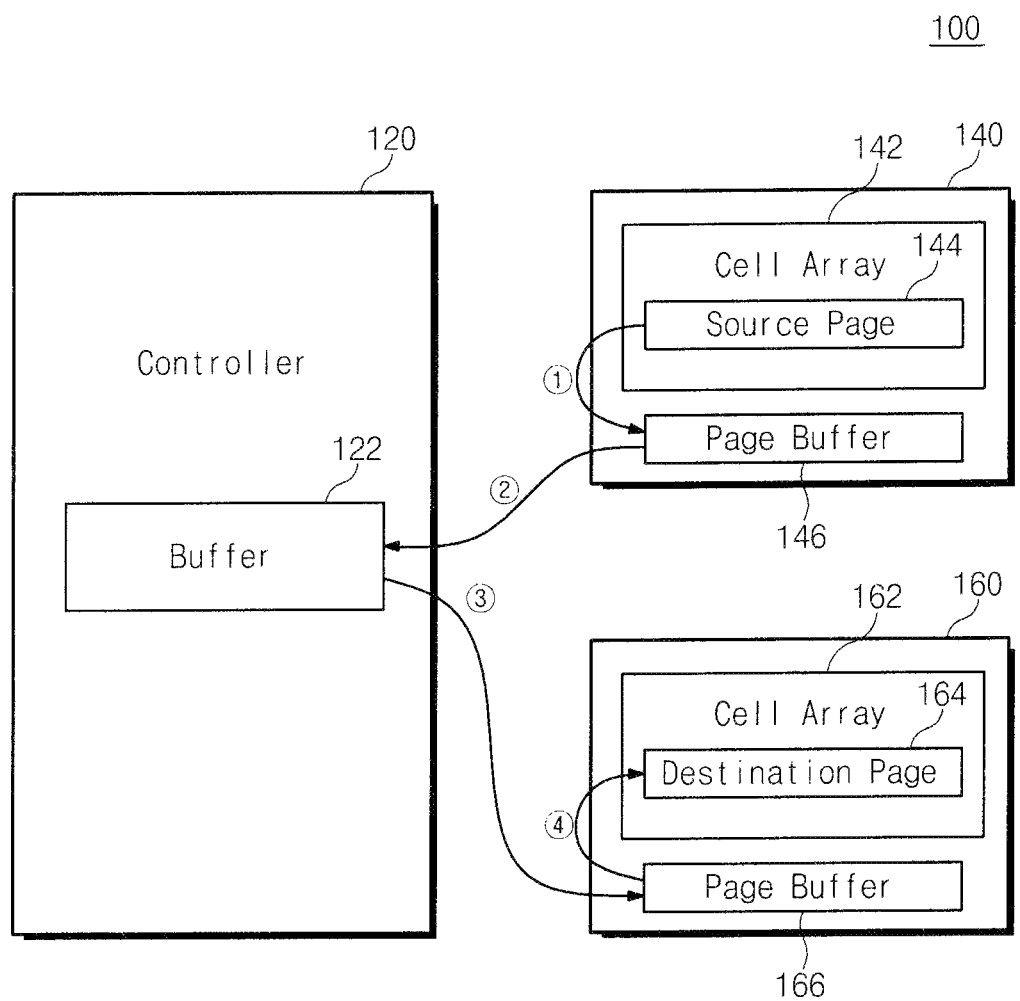
FIG. 2 is a schematic illustrating a pattern of data transmission between memories in the memory system.
Figure 3:
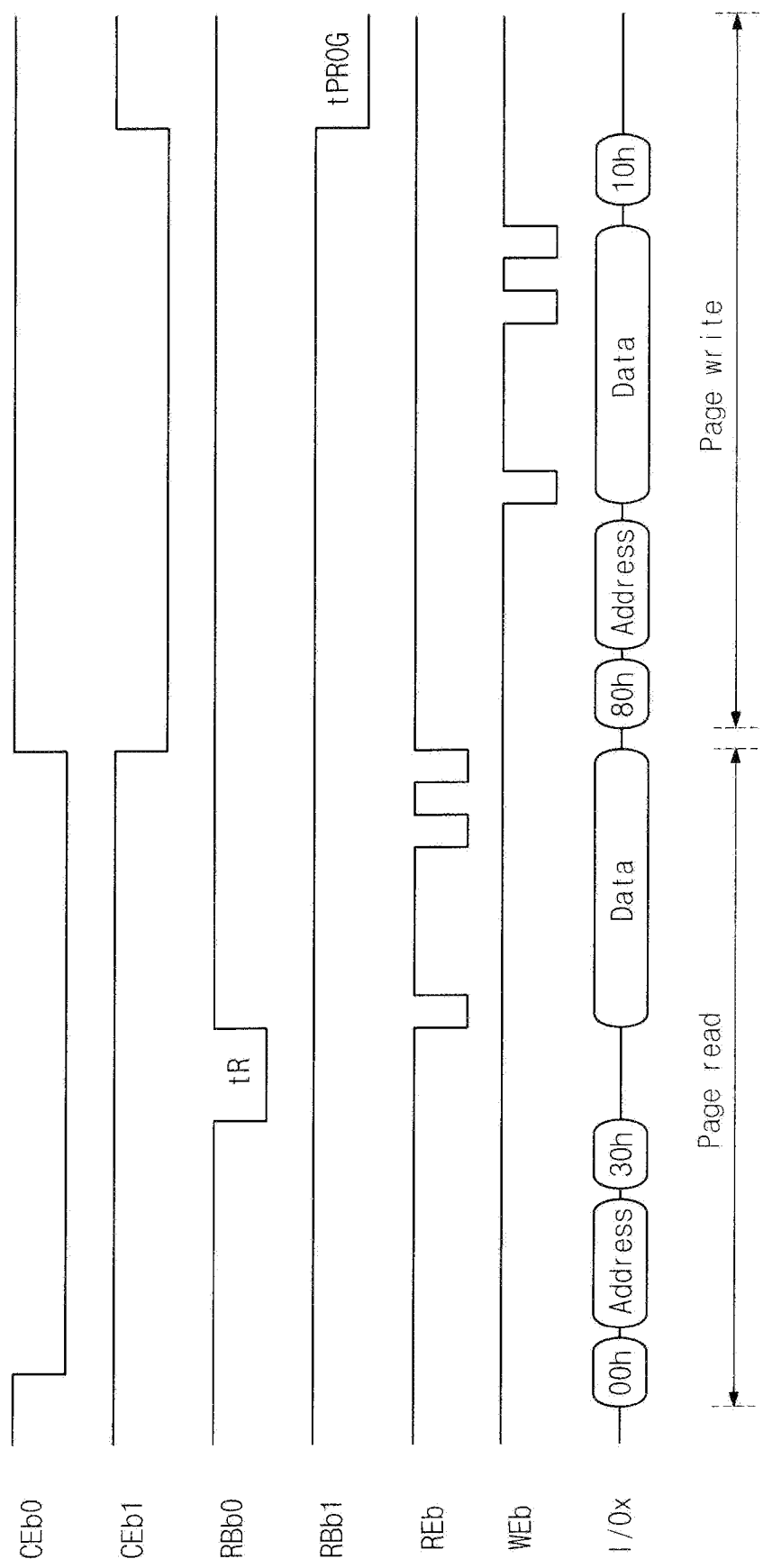
FIG. 3 is a timing diagram according to the data transmission pattern shown in FIG. 2.

Preferred embodiments of the present invention will be described below in more detail with reference to the accompanying drawings. The present invention may, however, be embodied in different forms and should not be constructed as limited to embodiments set forth herein. Rather, embodiments are provided so that this disclosure will be thorough and complete, and will fully convey the scope of the present invention to those skilled in the art. Like reference numerals refer to like elements throughout the accompanying figures.

Figure 4:
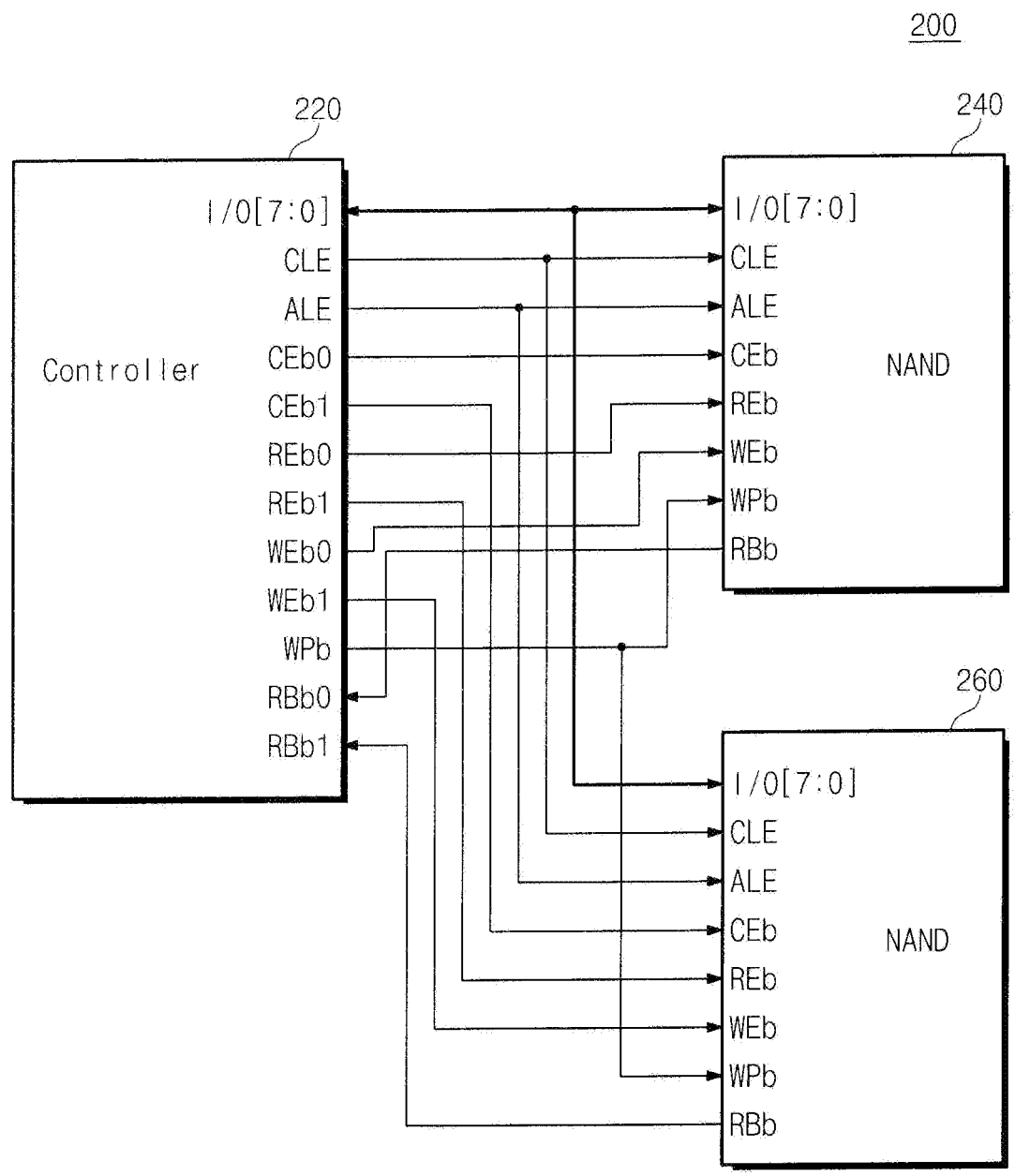
FIG. 4 is a block diagram of a memory system in accordance with an embodiment of the present invention.

FIG. 4 is a block diagram of a memory system 200 in accordance with an embodiment of the present invention. Referring to FIG. 4, the memory system 200 includes a controller 200 and memories 240 and 260. The memory system 200 according to an embodiment of the present invention stores data directly into the second memory 260 from the first memory 240 without passing through the controller 200, improving the efficiency of data transmission between the memories 240 and 260.

In FIG. 4, the memories 240 and 260 are implemented in NAND flash memories for convenience of description. As illustrated in FIG. 4, each of the NAND flash memories includes input/output pins I/O[7:0], a command latch-enable pin CLE, an address latch-enable pin ALE, a chip-enable pin CEb, a read-enable pin REb, a write-enable pin WEb, a write-protection pin WPb, and a ready/busy pin RBb.

The input/output pins I/O[7:0] are used for receiving a command, address signals, and data from the controller 220, and outputting data during a read operation. The input/output pins I/O[7:0] are conditioned in a floating state when the memory is deselected or there is no output therefrom.

The command latch-enable pin CLE receives a command signal from the controller 220. For example, when a signal input to the command latch-enable pin CLE at a rising edge of the write-enable signal WEb has a logically high level, the NAND flash memory identifies a signal, which is input through an input/output bus, as a command and latches the corresponding command in a register (not shown).

The address latch-enable ALE receives an address signal from the controller 220. For example, the NAND flash memory latches an address signal at a rising edge of the write-enable signal WEb when the address latch-enable signal ALE has a logically high level.

The chip-enable pin CEb receives a signal, which activates the NAND flash memory, from the controller 220.

The read-enable pin REb receives a signal, which outputs serial data of the NAND flash memory, from the controller 220.

The write-enable pin WEb receives a signal, which controls a write operation of the NAND flash memory, from the controller 220. For example, the NAND flash memory latches a command, an address signal, and data at a rising edge of the write-enable signal WEb.

The write-protection pin WPb receives a signal, which protects the NAND flash memory from being inadvertently read or written when there is a power variation, from the controller 220. For instance, when the write-protection signal WPb has a logically low level, an internal high voltage generator (not shown) of the NAND flash memory is reset.

The ready/busy pin RBb outputs a signal informing the controller 220 of a current state of the NAND flash memory. For example, while the NAND flash memory is conditioned in a write, erase, or read operation, the ready/busy signal RBb is output to the controller 220 having logically low level.

The memories 240 and 260 are NAND flash memories as aforementioned. Pin connection between the controller 220 and the memories 240 and 260 store data from the first memory 240 directly into the second memory 260 without passing through the controller 220. The chip-enable pins CEb, the read-enable pins REb, the write-enable pins WEb, and the ready/busy pins RBb, of the memories 240 and 260, are individually connected by the controller 220, except the write-protection pins WPb.

Figure 5:
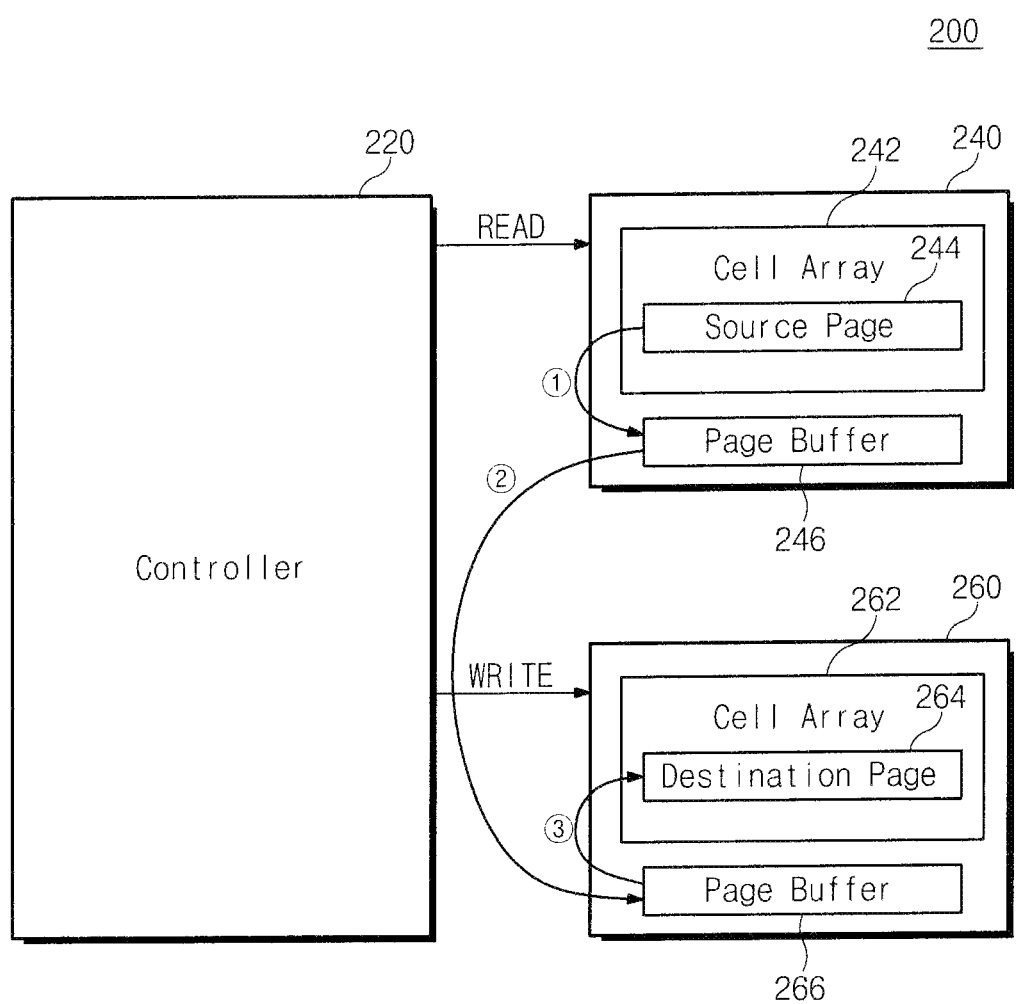
FIG. 5 is a schematic illustrating a pattern of data transmission between memories in the memory system according to an embodiment of the present invention.

FIG. 5 is a schematic illustrating a pattern of data transmission between the memories in the memory system 200 according to an embodiment of the present invention. Referring to FIG. 5, the memory system 200 includes the controller 220, the first memory 240, and the second memory 260. The first memory 240 includes a memory cell array 242 and a page buffer 246. The memory cell array 242 of the first memory 240 includes a source page 244 storing data to be transferred. The second memory 260 includes a page buffer 266 and a memory cell array 262 having a destination page 264 that stores data transferred from the first memory 240.

A NAND flash memory is operable with a read or write operation in the unit of a page.

The memory system 200 according to an embodiment of the present invention transfers data to the destination page 264 of the second memory 250, not to the controller 220, from the source page 244 of the first memory 240. Data of the source page 244 of the first memory 240 is transferred to the destination page 264 of the second memory 260 through the following course.

Referring to FIG. 5, the controller 220 transfers a read command READ to the first memory 240 and a write command WRITE to the second memory 260 at the same time. The first memory 240 loads data into the page buffer 246 from the source page 244 in response to the read comment READ provided from the controller 220. The second memory 260 is ready to conduct a write operation in response to the write command WRITE provided from the controller 220. The data loaded into the page buffer 246 moves to the page buffer 266 of the second memory 260, and the data transferred to the page buffer 266 is stored in the destination page 264.

While transferring data between the memories in the memory system 200, data does not pass through the controller 220. Thus, the memory system 200 is operable in a faster speed of data transmission.

Figure 6:
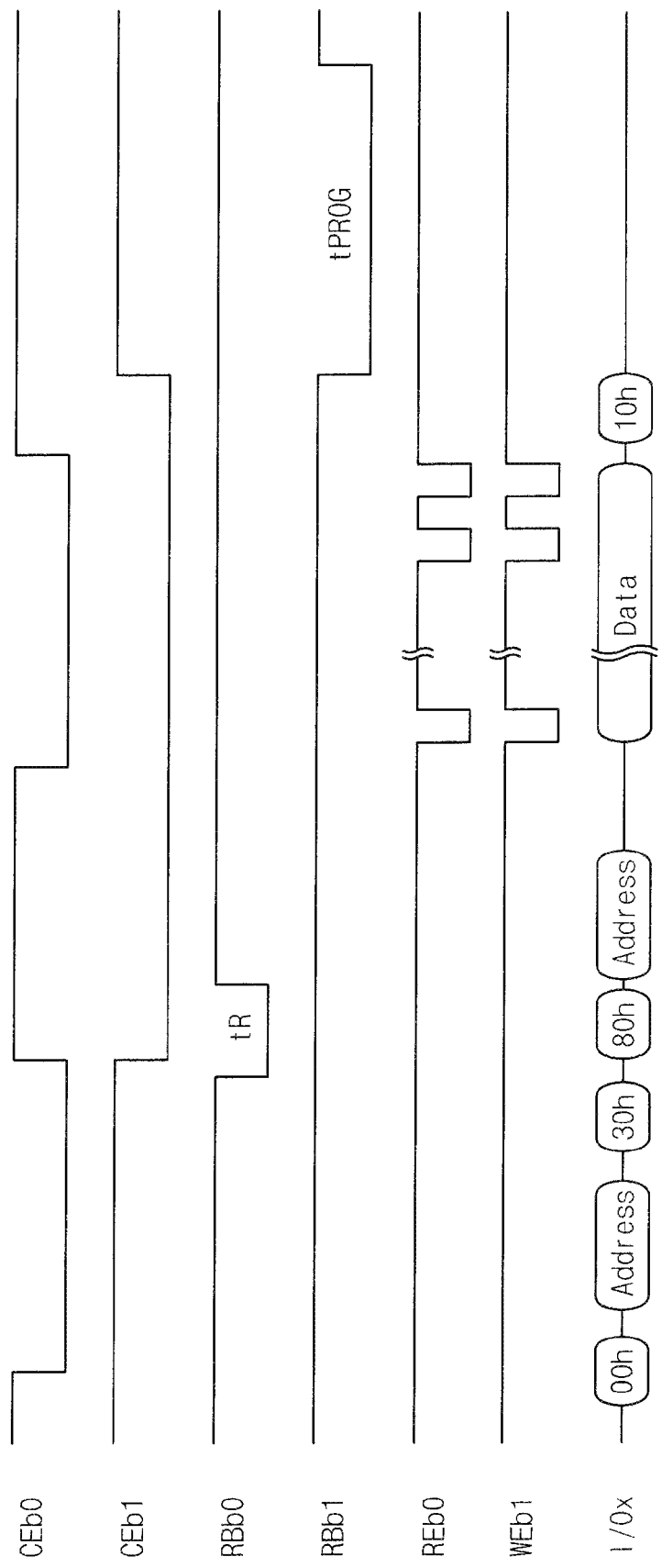
FIG. 6 is a timing diagram according to the data transmission pattern shown in FIG. 5.

FIG. 6 is a timing diagram according to the data transmission pattern shown in FIG. 5. Referring to FIG. 6, data is directly stored into the second memory 260 from the first memory 240 without passing through the controller 200, which will be detailed hereinafter.

To conduct a read operation of the first memory 240 in the memory system 200, the controller 220 transfers a first chip-enable signal CEb0 to the first memory 240. The first memory 240 is activated in response to a logical low level of the first chip-enable signal CEb0. The first memory 240 activated receives a read command 00h through a data bus in response to the command latch-enable signal CLE and receives an address through the data bus in response to the address latch-enable signal ALE. The first memory 240 loads data into the page buffer 246 from the source page 244. Simultaneously, the first memory 240 generates a ready/busy signal RBb0 to inhibit access to itself while loading the data.

During the read operation of the first memory 240, the controller 220 outputs a second chip-enable signal CEb1 to activate the second memory 260 and outputs the first chip-enable signal CEb0 to deactivate the first memory 240. The second memory 260 is activated in response to the second chip-enable signal CEb1 having a logically low level. The second memory 260 receives a write command 80h through the data bus in response to the command latch-enable signal CLE and receives an address corresponding thereto through the data bus in response to the address latch-enable signal ALE. After transferring the address to the second memory 260, the controller 220 outputs the first chip-enable signal CEb0 to reactivate the first memory 240 while the second memory 260 is being active.

The controller 220 applies a read-enable signal REb0 to the first memory 240 that is active. The first memory 240 outputs data to the data bus from the page buffer 246 in response to the read-enable signal REb0. At the same time, the controller 220 applies a write-enable signal WEb1 to the second memory 260 that is active. The second memory 260 loads the data, which is output from the page buffer 246 of the first memory 240, into the page buffer 266 of the second memory 260 in response to the write-enable signal WEb1. After completing data transmission from the page buffer 246 of the first memory 240 into the page buffer 266 of the second memory 260, the controller 220 applies a write command 10h to the second memory 260. When the write command 10h is input thereto, the second memory 260 starts to program the destination page 264 with the data transferred to the page buffer 266. Simultaneously, the second memory 260 outputs the ready/busy signal RBb1 having a logically low level to inhibit access to the second memory 260. The controller 220 outputs the chip-enable signals CEb0 and CEb1 to deactivate the first and second memories 240 and 260.

As such, the memory system 200 according to an embodiment of the present invention performs direct data transmission between the memories 240 and 260 without passing through the controller 220, which makes a data transmission time shorter.

Figure 7:
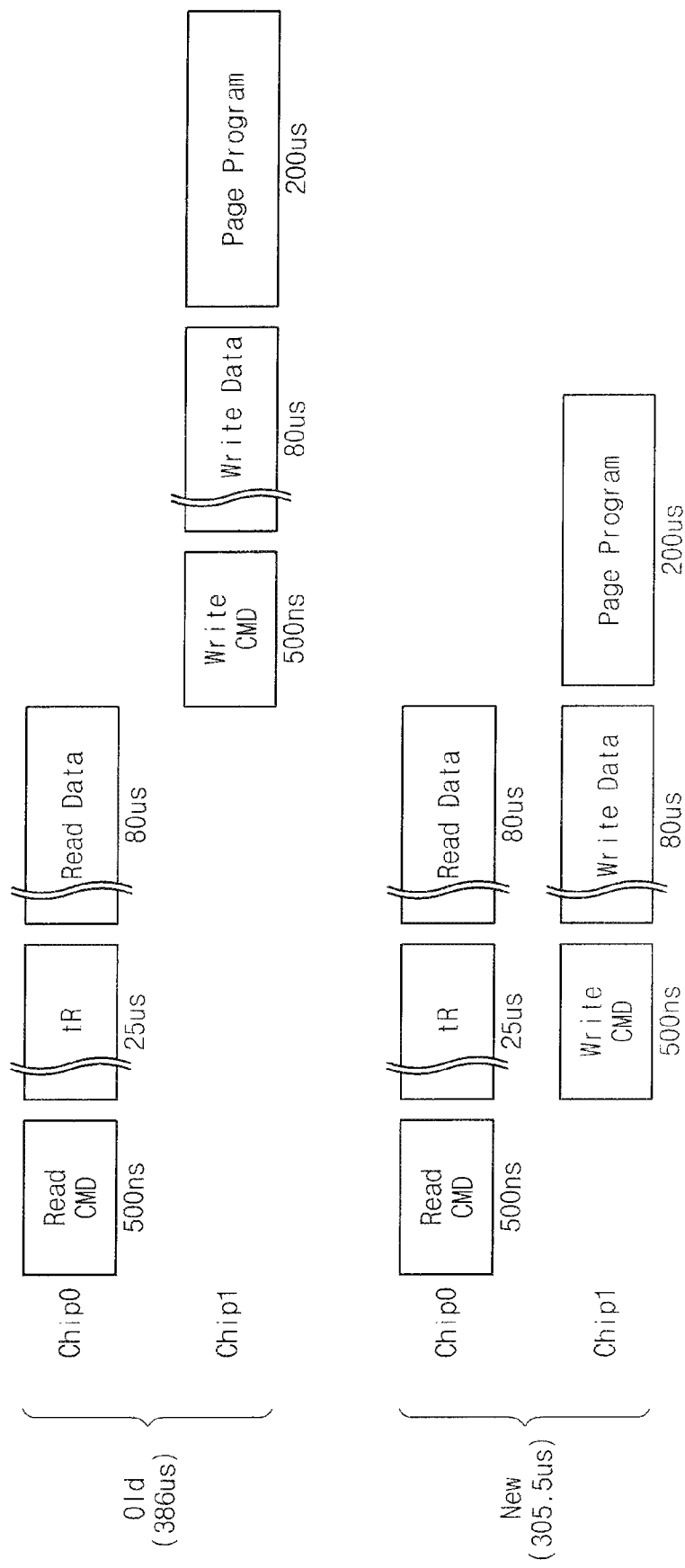
FIG. 7 comparatively illustrates data transmission times of the memory systems by the present invention and the art.

FIG. 7 comparatively illustrates data transmission times of the memory systems 200 according to an embodiment of the present invention and the memory system 100 shown in FIG. 1.

The memory system 100 conducts a write operation after a read operation. Referring to FIGS. 1 and 7, the whole time for data transmission between the memories 140 and 160 is 386 us summing up a time for transferring a read command to the first memory 240 from the controller 120 (500 ns), a time for loading data into the page buffer 146 from the source page 144 (25 us), a time for transferring the data from the page buffer 146 to the buffer 122 of the controller 120 (80 us), a time for transferring a write command to the second memory 160 from the controller 120 (500 ns), a time for transferring the data to the page buffer 166 of the second memory 160 from the buffer 122 of the controller 120, and a time for writing the data into the destination page 164 from the page buffer 166.

The memory system 200 according to an embodiment of the present invention stores data directly into the second memory 260 from the first memory 240 without passing through the controller 200. Referring to FIGS. 4 and 7, the whole time for data transmission is summed up just by a time for reading data from the source page 244 of the first memory 240 and a time for writing the data into the destination page 264 of the second memory 260. Thus, the whole data transmission time of the memory system 200 by the present invention becomes 305.5 us.

As a result, data transmission in the memory system 200 is improved up to 21% as compared to the memory system 100.

The memory system 200 according to an embodiment of the present invention is helpful to further reduce a data transmission time as a page size becomes larger.

The memory system 200 may be a memory card, e.g., a subscriber identity module (SIM) card.

As described above, the memory system according to an embodiment of the present invention is effective in shortening a time for transferring data between the memories by storing data into the second memory from the first memory without through the controller.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for transferring data in a memory system including at least first and second memories, the method comprising:
   activating the first memory to conduct a read operation;
   activating the second memory during the read operation of the first memory; and
   transferring data, which is obtained from the read operation, directly to the second memory from the first memory in response to a toggle of a first read-enable signal of the first memory while respective chip-enable signals of the first memory and the second memory have an active state, wherein first and second memories share a data bus, and the first and second write-enable signals are toggled by the controller, wherein the first and second memories receive the respective chip-enable signals, the first read-enable signal, a second read-enable signal, the first write-enable signal and the second write-enable signal, and send a first ready/busy signal and a second ready/busy signal each through respective lines coupled to the controller, and wherein the first and second memories are activated during transferring the data from the first memory to the second memory.

2. The method as set forth in claim 1, wherein the memory system further includes the controller operating to control the first and second memories, wherein the data read through the read operation is directly transferred to the second memory without passing through the controller.

3. The method as set forth in claim 2, wherein the first and second memories share the data bus for receiving a command, an address, and the data from the controller.

4. The method as set forth in claim 3, wherein the first and second memories are NAND flash memories.

5. The method as set forth in claim 4, wherein the activating of the first memory to conduct the read operation comprises:
    loading the data of a source page into a first page buffer of the first memory in response to a read command; and
    outputting the data, which is loaded into the first page buffer, to the data bus.

6. The method as set forth in claim 4, wherein the activating of the second memory during the read operation of the first memory comprises:
    transferring the data, which is output to the data bus by the activating of the first memory to conduct the read operation, to a second page buffer of the second memory; and
    storing the data into a destination page of the second page buffer.

7. The method as set forth in claim 6, wherein the activating of the first memory to conduct the read operation, the second memory is inactive while a read command and an address of the source page are being transferred to the first memory.

8. The method as set forth in claim 6, wherein in the activating of the second memory during the read operation of the first memory, the first memory is inactive while a write command and an address of the destination page are being transferred to the second memory.

9. The method as set forth in claim 8, wherein after transferring the address of the destination page, the first memory is activated.

10. The method as set forth in claim 9, wherein after the data is transferred to the second page buffer of the second memory from a first page buffer of the first memory, the first memory maintains an inactive state.

11. The method as set forth in claim 9, wherein while the data is transferred to the second memory from the first memory, the first read-enable signal and the second write-enable signal are simultaneously transferred to the first memory and the second memory, respectively.

12. The method as set forth in claim 6, further comprising indicating a state of the first memory by the first ready/busy signal and a state of the second memory by the second ready/busy signal.

13. The method as set forth in claim 1, wherein the activating of the second memory during the read operation of the first memory further comprises:
    generating a busy signal of the first memory to inhibit access to the first memory while activating the second memory; and
    loading read data to a first page buffer of the first memory.

14. A memory system comprising:
    a first memory configured to receive a read command through a data bus;
    a second memory configured to receive a write command through the data bus; and
    a controller configured to transfer data, which is read from the first memory by toggling a first read-enable signal of the first memory, directly to the second memory by toggling a second write-enable signal of the second memory through the data bus while respective chip-enable signals of the first memory and the second memory are in an active state,
    wherein the first and second memories receive the respective chip-enable signals, the first read-enable signal, a second read-enable signal, a first write-enable signal and the second write-enable signal, and send a first ready/busy signal and a second ready/busy signal each through respective lines coupled to the controller, and
    wherein the first and second memories are activated during transferring the data from the first memory to the second memory.

15. The memory system as set forth in claim 14, wherein the first and second memories are NAND flash memories.

16. The memory system as set forth in claim 14, wherein the second memory maintains an inactive state while transferring a read command and an address of a source page to the first memory.

17. The memory system as set forth in claim 14, wherein the first memory maintains an inactive state while transferring a write command and an address of a destination page to the second memory.

18. The memory system as set forth in claim 17, wherein after transferring the address of the destination memory, the first memory is activated.

19. The memory system as set forth in claim 18, wherein the first memory and the second memory comprise a first page buffer and a second page buffer, respectively, and wherein after the data is transferred to the second page buffer of the second memory from the first page buffer of the first memory, the first memory maintains an inactive state.

20. The memory system as set forth in claim 19, wherein while the data is transferred to the second memory from the first memory, the first read-enable signal and the second write-enable signal are toggled by the controller respectively.

21. The memory system as set forth in claim 14, wherein the memory system is a memory card.

22. The memory system as set forth in claim 14, wherein the first memory generates a busy signal to inhibit access to the first memory while activating the second memory and loads read data to a first page buffer of the first memory.

23. The memory system as set forth in claim 14, wherein the active state of the first memory and the second memory is indicated by the respective first and second ready/busy signals.

* * * * *